United States Patent
Lee

(10) Patent No.: US 9,236,109 B1
(45) Date of Patent: Jan. 12, 2016

(54) SEMICONDUCTOR DEVICE

(71) Applicant: SK hynix Inc., Icheon-si Gyeonggi-do (KR)

(72) Inventor: Tae Yong Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/572,362

(22) Filed: Dec. 16, 2014

(30) Foreign Application Priority Data

Oct. 7, 2014 (KR) ........................ 10-2014-0135008

(51) Int. Cl.
G11C 7/00 (2006.01)
G11C 11/406 (2006.01)
G11C 11/4076 (2006.01)

(52) U.S. Cl.
CPC .......... *G11C 11/406* (2013.01); *G11C 11/4076* (2013.01); *G11C 11/40603* (2013.01); *G11C 11/40618* (2013.01)

(58) Field of Classification Search
CPC ............. G11C 11/406; G11C 11/4076; G11C 11/40618; G11C 11/40603
USPC ..................... 365/222, 189.07, 194
See application file for complete search history.

(56) References Cited

U.S. PATENT DOCUMENTS

| | | | | |
|---|---|---|---|---|
| 4,933,908 A | * | 6/1990 | Byers | G11C 29/02 365/200 |
| 6,633,947 B1 | * | 10/2003 | Holman | G06F 13/4243 710/2 |
| 7,027,341 B2 | * | 4/2006 | Morikawa | G11C 7/062 365/189.09 |
| 7,062,587 B2 | * | 6/2006 | Zaidi | G06F 15/7832 710/100 |
| 8,072,829 B2 | | 12/2011 | Kim | |
| 8,601,204 B2 | * | 12/2013 | Rajan | G06F 13/4243 711/103 |
| 8,675,436 B2 | * | 3/2014 | Kim | G11C 11/406 365/222 |
| 8,885,430 B2 | * | 11/2014 | Sato | G11C 11/40618 365/222 |
| 8,949,520 B2 | * | 2/2015 | Ware | G06F 13/1636 711/106 |
| 8,958,259 B2 | * | 2/2015 | Sakakibara | G11C 11/40615 365/222 |
| 2013/0279283 A1 | | 10/2013 | Seo et al. | |
| 2014/0085999 A1 | * | 3/2014 | Kang | G11C 29/023 365/222 |
| 2015/0085596 A1 | * | 3/2015 | Cho | G11C 5/14 365/226 |
| 2015/0092508 A1 | * | 4/2015 | Bains | G11C 11/40618 365/222 |
| 2015/0162068 A1 | * | 6/2015 | Woo | G11C 11/40615 365/222 |

* cited by examiner

*Primary Examiner* — Viet Q Nguyen
(74) *Attorney, Agent, or Firm* — William Park & Associates Ltd.

(57) ABSTRACT

A semiconductor device includes a plurality of channels. Each of the channels includes a plurality of banks sequentially activated at intervals of a predetermined time in response to a refresh command; a comparator, when the refresh command is input to a corresponding channel, configured to detect whether the refresh command is applied to a contiguous channel; a delay decision unit configured to output a control signal to determine a bank active delay time in response to an output signal of the comparator; and a delay circuit configured to control an active delay time of the plurality of banks in response to an output signal of the delay decision unit.

19 Claims, 6 Drawing Sheets

SEMICONDUCTOR DEVICE

CROSS-REFERENCE TO RELATED APPLICATION

This application claims priority based upon Korean patent application No. 10-2014-0135008, filed on Oct. 7, 2014, the disclosure of which is hereby incorporated in its entirety by reference herein.

BACKGROUND

Embodiments of the invention relate to a semiconductor device, and more particularly to a technology for reducing refresh peak noise.

In recent times, the multi-channel semiconductor memory device has recently been proposed, which provides a large bandwidth and is highly integrated. The multi-channel semiconductor memory device includes a plurality of memories in a single chip, and each memory includes an input/output (I/O) pad so that it can be operated as a separate memory device. That is, each memory of the multi-channel semiconductor memory device may operate as an independent memory device for independently inputting/outputting an address, a command, and data.

Each channel for use in the multi-channel semiconductor memory device receives a command and an address separately from each other, such that each channel can be independently operated. Therefore, respective banks allocated to each channel are sequentially refreshed at intervals of a predetermined time within the tRFC time.

However, the multi-channel semiconductor memory device shares an internal voltage per channel, so that the multi-channel semiconductor memory device unavoidably has a serious defect under a condition in which all channels are simultaneously operated. That is, although banks contained in respective channels are sequentially refreshed, if all channels are simultaneously refreshed, the respective channels can be sequentially refreshed at intervals of a predetermined time. From the viewpoint of all chips, refresh times of the respective channels overlap with each other, resulting in increased peak noise.

SUMMARY

In accordance with an embodiment of the invention, a semiconductor device includes a plurality of channels. Each of the channels includes a plurality of banks sequentially activated at intervals of a predetermined time in response to a refresh command. The semiconductor device also includes a comparator, when the refresh command is input to a corresponding channel, configured to detect whether the refresh command is applied to a contiguous channel. The semiconductor device also includes a delay decision unit configured to output a control signal to determine a bank active delay time in response to an output signal of the comparator. The semiconductor device also includes a delay circuit configured to control an active delay time of the plurality of banks in response to an output signal of the delay decision unit.

In accordance with an embodiment of the invention, a semiconductor device includes a first channel including a plurality of banks configured to be sequentially activated at intervals of a predetermined time according to a refresh command. The semiconductor device also includes a second channel configured to delay an initial active section of the plurality of banks by an other predetermined time upon receiving the refresh command within a predetermined pulse section.

DETAILED DESCRIPTION

Reference will now be made in detail to embodiments of the invention, examples of which are illustrated in the accompanying figures. Wherever possible, the same reference numbers are used throughout the figures to refer to the same or like portions. In the following description of the invention, a detailed description of related known configurations or functions incorporated herein may be omitted for clarity of the subject matter of the invention. Various embodiments of the invention are directed to providing a semiconductor device which substantially obviates one or more problems due to limitations or disadvantages of related art. Embodiments of the invention may relate to a semiconductor device configured to determine whether refresh commands are simultaneously input to all channels on the basis of all chips. Embodiments of the invention may also adjust a delay time refreshed at each channel when the refresh commands are simultaneously input to all channels, resulting in reduction of peak noise. It is to be understood that both the foregoing general description and the following detailed description of the invention are explanatory and are intended to provide further explanation of the invention as claimed.

Figure 1:
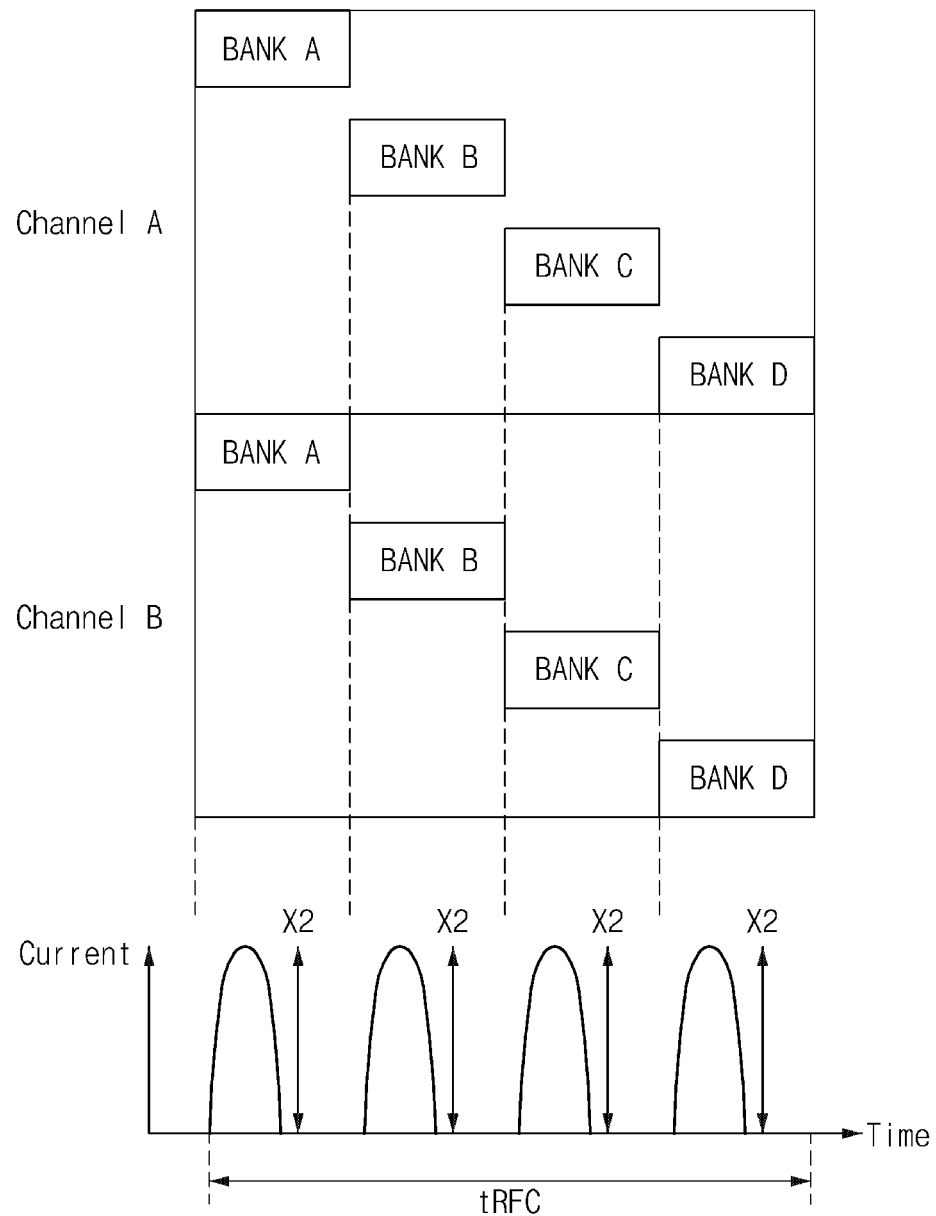
FIGS. 1 and 2 are conceptual diagrams illustrating a semiconductor device according to an embodiment of the invention.
Figure 2:
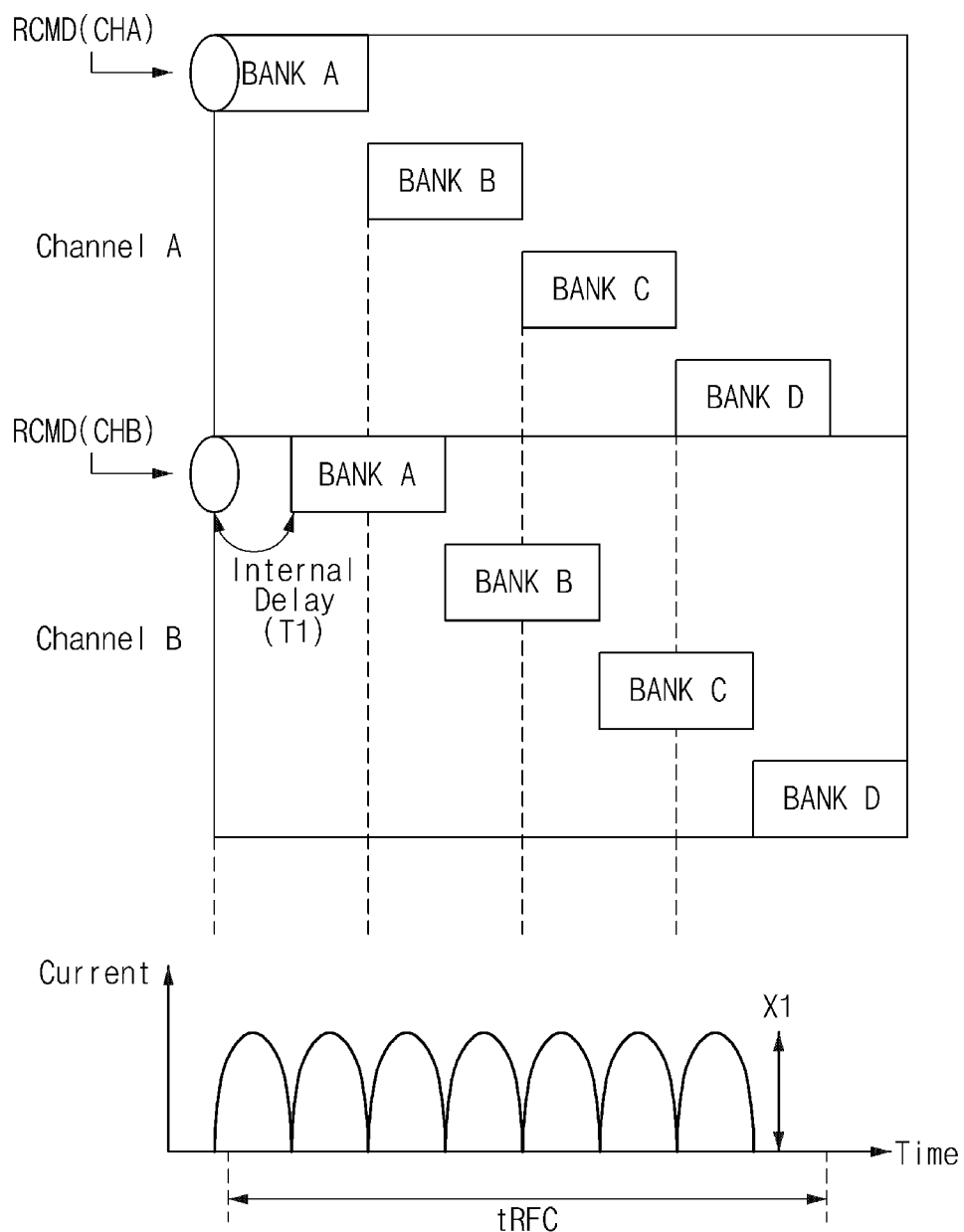

FIGS. 1 and 2 are conceptual diagrams illustrating a semiconductor device according to an embodiment of the invention.

Referring to FIG. 1, the multi-channel semiconductor memory device allows banks of respective channels to be sequentially enabled to reduce peak noise in such a manner that the refresh operation is performed. FIG. 1 illustrates a chip in which two channels and four banks are present.

In other words, upon receiving a refresh command from an external part, banks (A, B, C, D) are sequentially activated at intervals of a predetermined time in a channel A during a refresh row cycle time (tRFC), resulting in completion of the refresh operation. Upon receiving the refresh command, banks (A, B, C, D) are sequentially activated at intervals of a predetermined time in a channel B during the refresh row cycle time (tRFC), which results in the completion of the refresh operation.

Although four banks for each channel are sequentially activated, if external refresh commands are simultaneously input to the individual channels, as many bank active time points as the number of channels may overlap with one another on the basis of a total number of chips. In this instance, the banks A of the channels (A, B) simultaneously perform the refresh operation, so that it can be recognized that a peak current is increased twice. More specifically, the peak current is multiplied as many times as the number of channels, such that the resultant peak current increases. In addition, the peak current also increases in banks (B, C, D) of each channel (A or B).

Therefore, an embodiment of the invention detects a refresh command between channels as shown in FIG. 2, so that it adjusts a bank active time point in a manner that banks between channels are not simultaneously activated.

In particular, upon receiving a refresh command from an external part, an embodiment illustrates whether the refresh command (RCMD) is simultaneously applied to the channel A and the channel B.

If the refresh command (RCMD) is simultaneously applied to the channel A and the channel B, banks (A, B, C, D) are sequentially activated at intervals of a predetermined time in the channel A during the refresh row cycle time (tRFC), resulting in completion of the refresh operation. Moreover, the channel A may sequentially activate the respective banks upon receiving the refresh command RCMD(CHA).

The channel B may sequentially activate the respective banks after lapse of an internal delay time (T1) from an input time of the active command RCMD(CHB). More specifically, banks (A, B, C, D) are sequentially activated at intervals of a predetermined time in the channel B during the refresh row cycle time (tRFC), resulting in completion of the refresh operation. In this case, the banks are simultaneously activated in each channel (A or B) such that the peak current is not increased.

Figure 3:
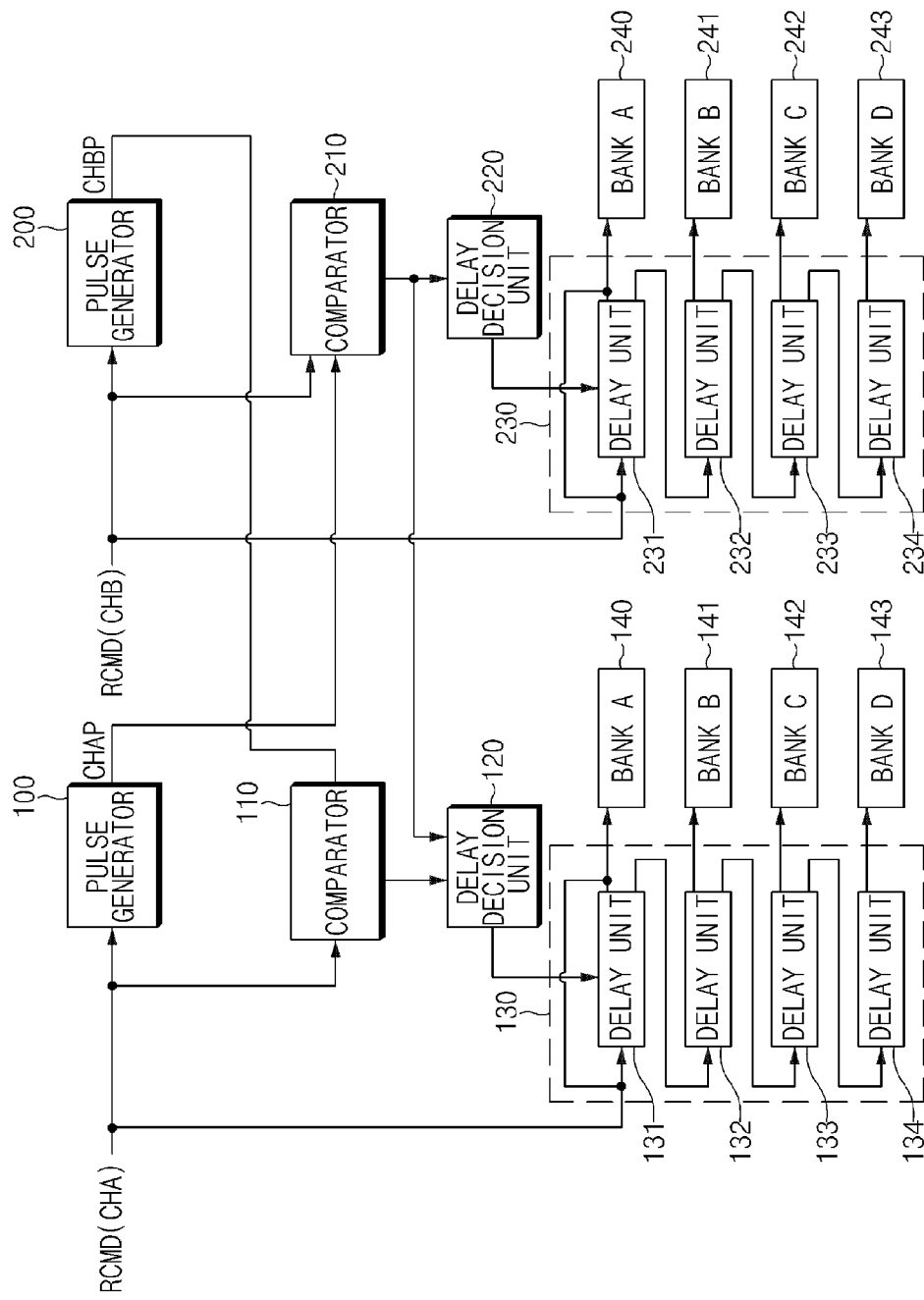
FIG. 3 is a block diagram illustrating a semiconductor device according to an embodiment of the invention.

Referring to FIG. 3, a block diagram illustrating a semiconductor device according to an embodiment of the invention is illustrated.

As shown in FIG. 3, the semiconductor device includes pulse generators (100, 200), comparators (110, 210), delay decision units (120, 220), delay circuits (130, 230), and banks (140~143, 240~243).

In this case, the pulse generator 100, the comparator 110, the delay decision unit 120, the delay circuit 130, and the banks (140~143) may be constituent elements of the channel A (CHA). The pulse generator 200, the comparator 210, the delay decision unit 220, the delay circuit 230, and the banks (240~243) may be constituent elements of the channel B (CHB).

If an external refresh command (RCMD) for the channel A (CHA) is applied to the pulse generator 100, the pulse generator 100 generates a pulse signal (CHAP) having a predetermined pulse width. The pulse generator 100 also outputs the pulse signal (CHAP) to the comparator 210. The comparator 110 compares the pulse signal (CHAP) received by the external refresh command (RCMD) with the pulse signal (CHBP) received from the pulse generator 200 of the channel B (CHB). The comparator 110 also outputs the result of comparison to the delay decision unit 120.

In addition, the delay decision unit 120 may determine whether the bank active signal is delayed in response to output signals of the comparator 110 of the channel A (CHA) and the comparator 210 of the channel B (CHB). The delay decision unit 120 may also determine an active delay time.

The delay circuit 130 may include a plurality of delay units (131~134). Upon receiving an external refresh command (RCMD) for the channel A (CHA), the delay unit (131~134) may sequentially delay the refresh command (RCMD), and may output the delayed refresh command (RCMD) to the banks (140~143). In this case, the plurality of delay units (131~134) may have the same delay time.

More specifically, upon receiving the refresh command (RCMD), the refresh command (RCMD) signal is delayed by a predetermined delay time so that the bank 140 is activated. Upon receiving the refresh command (RCMD), the refresh command (RCMD) signal is delayed by a delay time of the delay units (131, 132) so that the bank 141 is activated. Upon receiving the refresh command (RCMD), the refresh command (RCMD) signal is delayed by a delay time of the delay units (131~133) so that the bank 142 is activated. Upon receiving the refresh command (RCMD), the refresh command (RCMD) signal is delayed by a delay time of the delay units (131~134) so that the bank 143 is activated.

In addition, upon receiving an external refresh command (RCMD) for the channel B (CHB), the pulse generator 200 generates a pulse signal (CHBP) having a predetermined pulse width. The pulse generator 200 also outputs the pulse signal (CHBP) to the comparator 210. The comparator 210 compares the pulse signal (CHBP) received by the external refresh command (RCMD) with the pulse signal (CHAP) received from the pulse generator 100 of the channel A (CHA). The comparator 210 also outputs the result of comparison to the delay decision unit 220.

In addition, the delay decision unit 220 may determine whether the bank active signal is delayed in response to an output signal of the comparator 210 of the channel B (CHB). The delay decision unit 220 may also determine an active delay time.

The delay circuit 230 may include a plurality of delay units (231~234). Upon receiving an external refresh command (RCMD) for the channel B (CHB), the delay units (231~234) may sequentially delay the refresh command (RCMD), and may output the delayed refresh command (RCMD) to the banks (240~243). In this instance, the plurality of delay units (231~234) may have the same delay time.

More specifically, upon receiving the refresh command (RCMD), the refresh command (RCMD) signal is delayed by a predetermined delay time so that the bank 240 is activated. Upon receiving the refresh command (RCMD), the refresh command (RCMD) signal is delayed by a delay time of the delay units (231, 232) so that the bank 241 is activated. Upon receiving the refresh command (RCMD), the refresh command (RCMD) signal is delayed by a delay time of the delay units (231~233) so that the bank 242 is activated. Upon receiving the refresh command (RCMD), the refresh command (RCMD) signal is delayed by a delay time of the delay units (231~234) so that the bank 243 is activated.

Figure 4:
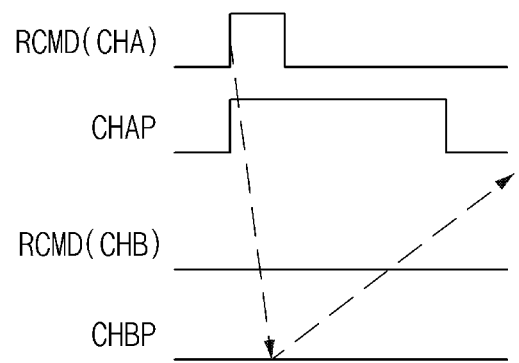
FIGS. 4 to 6 are waveform diagrams illustrating the operations of the semiconductor device shown in FIG. 3.
Figure 5:
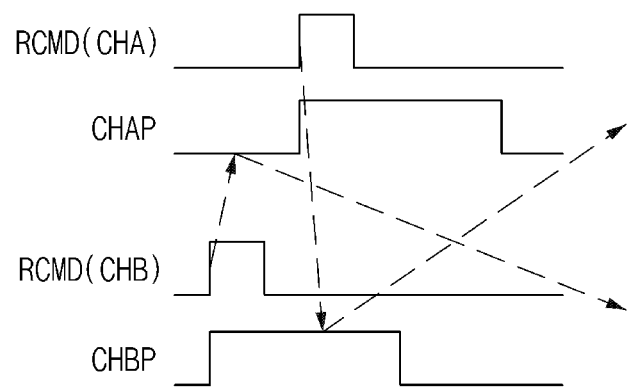
Figure 6:
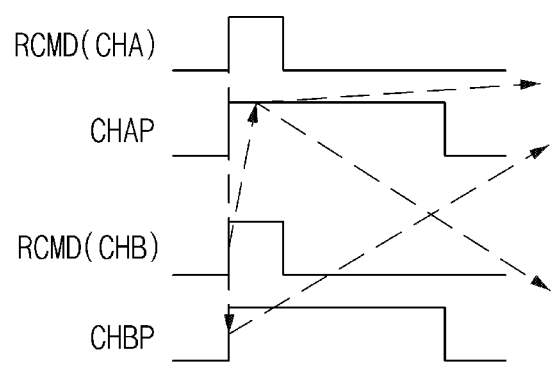

Referring to FIGS. 4 to 6, waveform diagrams illustrating the operations of the semiconductor device shown in FIG. 3 are illustrated.

As shown in FIG. 4, the refresh command (RCMD) is not simultaneously applied to the channel A and the channel B. In addition, the refresh command (RCMD) is applied only to the channel A.

Upon receiving the external refresh command (RCMD) for the channel A (CHA), the pulse generator 100 generates the pulse signal (CHAP) enabled to a high level during a predetermined time. The pulse generator 100 also outputs the pulse signal (CHAP) to the comparator 210. In this case, it is assumed that the external refresh command (RCMD) is not applied to the channel B (CHB). As a result, the pulse generator 200 may output the pulse signal (CHBP) of a low level.

Thereafter, the comparator 110 compares the external refresh command RCMD(CHA) of a high level with the pulse signal (CHBP) of a low level. The comparator 110 also outputs the result of comparison to the delay decision unit 120. Upon receiving the external refresh command RCMD(CHA) of a high level and the pulse signal (CHBP) of a low level, the comparator 110 determines that the refresh command was applied only to the channel A. Therefore, the comparator 110 outputs a low-level signal when the refresh command RCMD (CHA) signal and the pulse signal (CHBP) are not high in level.

Upon receiving the low-level signal from the comparator 110, the delay decision unit 120 outputs a bank active signal by bypassing delay units of the delay circuit 130. In this instance, since the output signals of the comparators (110, 210) are at a low level, the delay decision unit 120 determines that the refresh command (RCMD) is not simultaneously applied to the channel A and the channel B.

Therefore, upon receiving the refresh command (RCMD) signal, a first bank 140 is immediately activated without a delay time. The remaining banks (141~143) are sequentially activated after lapse of the delay times of the delay units (132~134).

FIG. 5 shows a case in which the refresh command (RCMD) is first applied to the channel B at a time earlier than the channel A.

Upon receiving the external refresh command (RCMD) for the channel A (CHA), the pulse generator 200 generates the pulse signal (CHBP) enabled to a high level during a predetermined time. The pulse generator 200 also outputs the pulse signal (CHBP) to the comparator 110. In this case, when the external refresh command (RCMD) is not applied to the channel B (CHB), the external refresh command (RCMD) is not applied to the channel A (CHA). As a result, the pulse signal (CHAP) for the channel A (CHA) is at a low level.

Upon receiving the external refresh command (RCMD) for the channel B (CHB), the pulse generator 200 may output the pulse signal (CHBP) of a high level. The comparator 210 compares the external refresh command RCMD(CHB) signal of a high level with the pulse signal (CHAP) of a low level. The comparator 210 also outputs the result of comparison to the delay decision unit 220. In this case, if the refresh command RCMD(CHB) signal and the pulse signal (CHAP) are not high in level, the comparator 210 outputs a low-level signal.

Upon receiving the low-level signal from the comparator 210, the delay decision unit 220 outputs a bank active signal by bypassing delay units of the delay circuit 230. In this instance, since the output signals of the comparators (110, 210) are at a low level, the delay decision unit 220 determines that the refresh command (RCMD) is not simultaneously input to the channel A and the channel B.

Therefore, upon receiving the refresh command (RCMD) signal, a first bank 240 is immediately activated without a delay time. The remaining banks (241~243) are sequentially activated after lapse of the delay times of the delay units (232~234).

Thereafter, if an external refresh command (RCMD) for the channel A (CHA) is shaped as a high-level pulse signal and then applied to the pulse generator 100, the pulse generator 100 is enabled to a high level during a predetermined time. In this instance, the pulse signal (CHBP) of the channel B (CHB) remains at a high level.

The comparator 110 compares the high-level refresh command (RCMD) with the high-level pulse signal (CHBP). If the high-level refresh command (RCMD) and the high-level pulse signal (CHBP) are at a high level, the comparator 110 outputs a high-level signal. If the output signal of the comparator 110 is at a high level, the delay decision unit 120 determines that the bank 240 of the channel B has already been activated.

Therefore, the delay decision unit 120 delays the refresh command (RCMD) by an initial delay time of the delay unit 131. The delay decision unit 120 then activates the bank 140.

After lapse of the delay times of the delay units (132~134), the remaining banks (141~143) are sequentially activated.

FIG. 6 shows a case in which the refresh command (RCMD) is simultaneously applied to the channel A and the channel B.

Upon receiving the external refresh command (RCMD) for the channel A (CHA), the pulse generator 100 generates the pulse signal (CHAP) enabled to a high level during a predetermined time. The pulse generator also outputs the pulse signal (CHAP) to the comparator 210.

Upon receiving the external refresh command (RCMD) for the channel B (CHB), the pulse generator 200 generates the pulse signal (CHBP) enabled to a high level during a predetermined time. The pulse generator 200 also and outputs the generated pulse signal (CHBP) to the comparator 110.

The comparator 110 compares the external refresh command RCMD(CHA) signal of a high level with the pulse signal (CHBP) of a high level. The comparator 110 also outputs the result of comparison to the delay decision unit 120. In this case, since the refresh command RCMD(CHA) signal and the pulse signal (CHBP) are at a high level, the comparator 110 outputs a high-level signal.

The comparator 210 compares the external refresh command RCMD(CHB) signal of a high level with the pulse signal (CHAP) of a high level. The comparator 210 also outputs the result of comparison to the delay decision unit 220. In this case, since the refresh command RCMD(CHB) signal and the pulse signal (CHAP) are at a high level, the comparator 210 outputs a high-level signal.

Thereafter, upon receiving the high-level signal from the comparator 110, the delay decision unit 120 outputs a bank active signal by bypassing delay units of the delay circuit 130. In this instance, since the output signals of the comparators (110, 210) are at a high level, the delay decision unit 120 determines that the refresh command (RCMD) is simultaneously input to the channel A and the channel B in a manner that the bank 140 for the channel A is first activated.

Therefore, upon receiving the refresh command (RCMD) signal, the first bank 140 is immediately activated without a delay time. The remaining banks (141~143) are sequentially activated after lapse of the delay times of the delay units (132~134).

In this case, if the output signal of the comparator 210 is at a high level, the delay decision unit 220 determines that the bank 140 of the channel A has already been activated. Accordingly, the delay decision unit 220 delays the refresh command (RCMD) by an initial delay time of the delay unit 231. The delay decision unit 220 also then activates the bank 240. After lapse of the delay times of the delay units (232~234), the remaining banks (241~243) are sequentially activated.

As described above, an embodiment of the invention does not simultaneously activate respective banks between channels. Further, an embodiment of the invention allows the respective banks to be activated in a time-sharing manner.

An embodiment of FIG. 6 has disclosed that, if the refresh command is simultaneously input to the channel A and the channel B, the banks of the channel A are first activated at a time earlier than the channel B for convenience of description and better understanding of the invention. However, the scope or spirit of the invention is not limited thereto. If the refresh command is simultaneously input to the channel A and the channel B, the banks of the channel B may first be activated earlier than the channel A.

Figure 7:
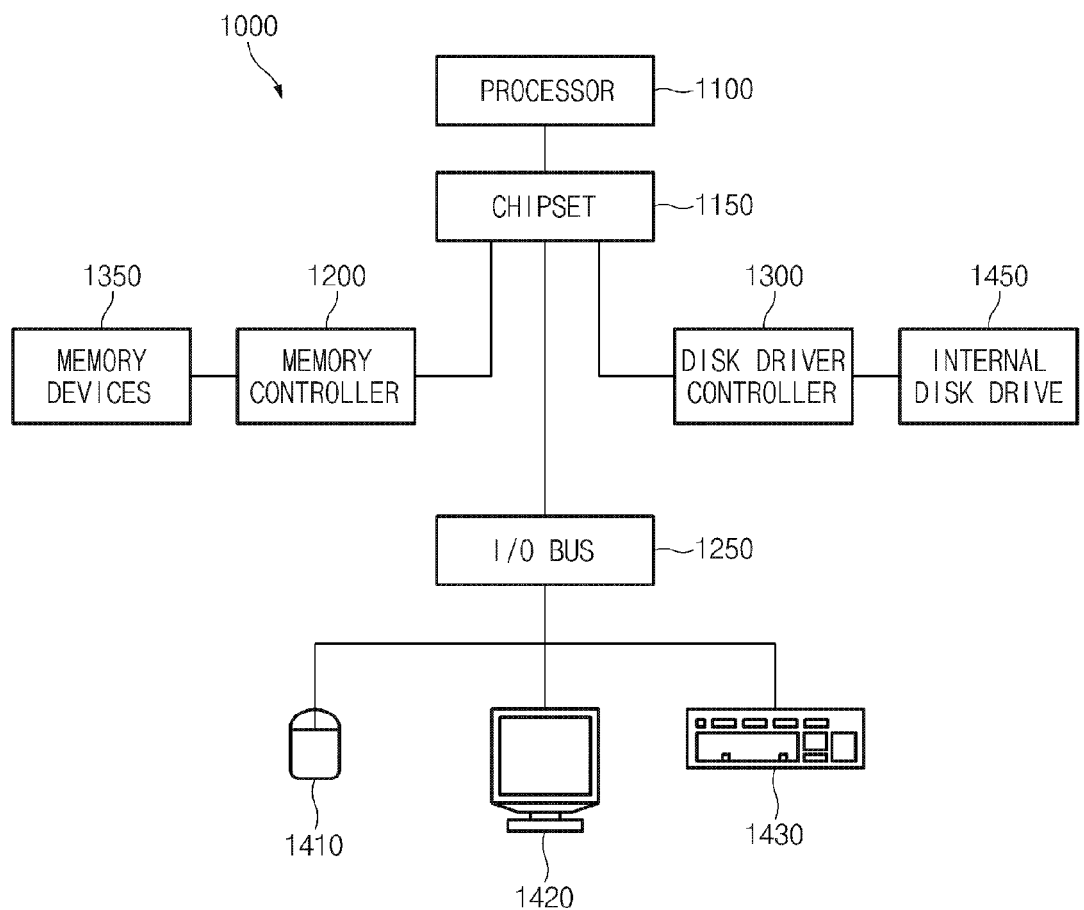
FIG. 7 illustrates a block diagram of a system employing a memory controller circuit in accordance with an embodiment of the invention.

Referring to FIG. 7, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

In addition, although the embodiments of the invention have exemplarily disclosed two channels for convenience of description and better understanding of the invention, the scope or spirit of the invention is not limited thereto. Further, the embodiments can also be applied to other devices, for example, a device having 4 channels or devices having 8 or more channels. In addition, if the embodiments of the invention are applied to the device having two or more channels, every two channels may be paired such that the bank active priority may be decided on the basis of the paring result.

As is apparent from the above description, the semiconductor device according to the embodiments reduces a refresh peak current for use in a multi-channel semiconductor memory device. The semiconductor device also prevents an internal voltage drop caused by a peak current and improves unique characteristics of a cell storing data therein.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a plurality of channels, each including:
      a plurality of banks sequentially activated at intervals of a predetermined time in response to a refresh command;
      a pulse generator configured to generate a pulse signal having a predetermined pulse width in response to the refresh command;
      a comparator, when the refresh command is input to a first channel, configured to compare the refresh command with the pulse signal received from the pulse generator of a second channel and detect whether the refresh command is applied to the second channel;
      a delay decision unit configured to output a control signal to determine a bank active delay time in response to an output signal of the comparator; and
      a delay circuit configured to control an active delay time of the plurality of banks in response to an output signal of the delay decision unit.

2. The semiconductor device according to claim 1, wherein:
   if the refresh command is input to the first channel and to the second channel, the comparator outputs a high-level signal.

3. The semiconductor device according to claim 1, wherein:
   if the refresh command is applied to both the first channel and the second channel, the delay decision unit activates the plurality of banks by bypassing a delay circuit of the first channel.

4. The semiconductor device according to claim 1, wherein the delay circuit sequentially delays the refresh command in response to a control signal of the delay decision unit, and outputs the delayed refresh command to the plurality of banks.

5. The semiconductor device according to claim 1, wherein the delay circuit includes a plurality of delay units configured to sequentially delay the refresh command.

6. The semiconductor device according to claim 5, wherein the plurality of delay units have the same delay time.

7. A semiconductor device comprising:
   a first channel including a plurality of banks configured to be sequentially activated at intervals of a predetermined time according to a refresh command; and
   a second channel configured to delay an initial active section of the plurality of banks by an other predetermined time upon receiving the refresh command within a predetermined pulse section,
   wherein the first channel includes:
   a first pulse generator configured to generate a first pulse signal having a predetermined pulse width in response to the refresh command;
   a first comparator configured to determine whether the refresh command is applied to the second channel upon receiving the refresh command;
   a first delay decision unit configured to output a control signal to determine a bank active delay time in response to an output signal of the first comparator; and
   a first delay circuit configured to control an active delay time of the plurality of banks in response to an output signal of the first delay decision unit.

8. The semiconductor device according to claim 7, wherein the second channel allows the plurality of banks to be sequentially activated at intervals of a predetermined time after lapse of a delay time of the initial active section.

9. The semiconductor device according to claim 7, wherein:
if the first comparator receives the refresh command and the refresh command is applied to the first channel, the first comparator outputs a high-level signal.

10. The semiconductor device according to claim 7, wherein:
if the refresh command is applied to both the first channel and the second channel, the first delay decision unit activates the plurality of banks by bypassing a delay circuit of the first channel.

11. The semiconductor device according to claim 7, wherein the first delay circuit sequentially delays the refresh command in response to a control signal of the first delay decision unit, and outputs the delayed refresh command to the plurality of banks.

12. The semiconductor device according to claim 7, wherein the first delay circuit includes a plurality of delay units configured to sequentially delay the refresh command.

13. The semiconductor device according to claim 12, wherein the plurality of delay units have the same delay time.

14. The semiconductor device according to claim 7, wherein the second channel includes:
a second pulse generator configured to generate a second pulse signal having a predetermined pulse width in response to the refresh command;
a second comparator configured to detect whether the refresh command is applied to the first channel upon receiving the refresh command;
a second delay decision unit configured to output a control signal to determine a bank active delay time in response to an output signal of the second comparator; and
a second delay circuit configured to control an active delay time of the plurality of banks in response to an output signal of the second delay decision unit.

15. The semiconductor device according to claim 14, wherein:
if the second comparator receives the refresh command and the refresh command is applied to the first channel, the second comparator outputs a high-level signal.

16. The semiconductor device according to claim 14, wherein:
if the refresh command is applied to both the first channel and the second channel, the second delay decision unit activates the plurality of banks by bypassing a delay circuit of the second channel.

17. The semiconductor device according to claim 14, wherein the second delay circuit sequentially delays the refresh command in response to a control signal of the second delay decision unit, and outputs the delayed refresh command to the plurality of banks.

18. The semiconductor device according to claim 14, wherein the second delay circuit includes a plurality of delay units configured to sequentially delay the refresh command.

19. The semiconductor device according to claim 18, wherein the plurality of delay units have the same delay time.

* * * * *